United States Patent [19]
Arnold et al.

[11] Patent Number: 4,715,430
[45] Date of Patent: Dec. 29, 1987

[54] ENVIRONMENTALLY SECURE AND THERMALLY EFFICIENT HEAT SINK ASSEMBLY

[75] Inventors: Allen J. Arnold, La Grangeville; Mark G. Courtney, Poughkeepsie; Diane N. Kirby, Poughkeepsie; Katherine H. Mis, Poughkeepsie; Kerry L. Sutton, Wappingers Falls, all of N.Y.

[73] Assignee: International Business Machines Corporation, Armonk, N.Y.

[21] Appl. No.: 923,456

[22] Filed: Oct. 27, 1986

[51] Int. Cl.$^4$ .......................................... H01L 23/40
[52] U.S. Cl. ................................. 165/80.3; 165/185
[58] Field of Search .................. 165/80.3, 185; 357/81

[56] References Cited

U.S. PATENT DOCUMENTS 3,414,775 12/1968 Melan et al. .................... 357/81 X
4,483,389 11/1984 Balderes et al. .................. 165/80.3
4,561,011 12/1985 Kohara et al. ...................... 357/81
4,607,685 8/1986 Mitchell, Jr. .................... 165/185 X

FOREIGN PATENT DOCUMENTS 44854 3/1984 Japan ..................................... 357/81

Primary Examiner—Albert W. Davis, Jr.
Assistant Examiner—Peggy Neils
Attorney, Agent, or Firm—John D. Crane

[57] ABSTRACT

A heat sink is disclosed for cooling a module having a plurality of chip sites thereon. The heat sink includes a frame member which is made of a material having a coefficient of thermal expansion which is substantially that of the substrate to which it is bonded. The frame has a plurality of fins disposed around the perimeter and a support surface disposed inside the perimeter fins. An insert member made of a high thermal conductivity material rests on the support surface. The insert member has a plurality of fins disposed on one side thereof and a plurality of projections on the other side. Forced air flowing around the fins provides a mechanism for rapidly removing heat therefrom. Each of the projections is disposed above a chip site and extends almost into contact with the upper surface of a chip mounted on the module substrate. A thermal paste is used to transfer heat directly from the chip to the insert member hence a mechanism is provided for rapidly removing heat developed in each chip of the module. The insert member is bonded to the frame member with an appropriate environmentally secure bond to assure that the atmosphere within the module remains the same over the planned life of the product. The spacing between the projections advantageously provides a path for engineering wiring and component changes to be added to the module should such changes become necessary.

16 Claims, 7 Drawing Figures

ENVIRONMENTALLY SECURE AND THERMALLY EFFICIENT HEAT SINK ASSEMBLY

FIELD OF THE INVENTION

The present invention relates broadly to the field of heat sinks and particularly to the field of environmentally secure and thermally efficient heat sinks for use with semiconductor integrated circuit modules.

BACKGROUND OF THE INVENTION

Heat build up in semiconductor products has long been a problem and, accordingly, much attention has been paid to maintaining the operating temperatures thereof at levels below which the semiconductor circuit is not damaged. As circuit densities have increased with the advent of VLSI circuits and the like, the sources of heat within a given chip have increased. As such, apparatus for removing heat from each of the chips have been frequently required. This is especially true for circuit modules containing a plurality of chip sites.

Because the problem of keeping semiconductor chips cool has been experienced for many years, numerous heat sink designs have been developed to meet the requirements of various systems in which semiconductor chips are used. One example of a heat sink is illustrated in the IBM Technical Disclosure Bulletin Vol. 27 No. 11, April 1985 at page 6726. The apparatus shown there has a plurality of spring biased pistons each being disposed adjacent to a chip site on the substrate. The pistons are all carried by a module cap which has a plurality of fins extending therefrom. Air is forced downward toward the upwardly extending fins. No mechanism is shown, however, to provide an environmentally secure bond between the module cap and the substrate.

A similar arrangement is illustrated in the IBM Technical Disclosure Bulletin Vol. 28, No. 7 December 1985 at page 3058. In this configuration, however, an adhesive joint 5 is provided around the perimeter of the module to secure the cap 3 to the module. The nature of the material used for this purpose is not disclosed. Tests have shown that adhesives can be used to bond the cap to the substrate, however, most such adhesives are permeable to the ambient atmosphere and after a relatively short period of time, the atmosphere in the module equilibrates with the ambient. This may cause water vapor to enter the module which is very destructive on the wiring therein. Metal bonding could be employed as well but usually with adverse effects as well. If a solder is used, the cap and substrate are sealed. If the temperature excursions are sufficiently great and the thermal coefficient of expansion of the cap and that of the substrate are sufficiently different, stresses will occur which will cause the solder to crack, thereby destroying the environmental seal. If a low temperature melting solder is used, the solder will melt at a temperature below the operating temperature thereby overcoming the problem caused by thermal cycling, however, no means remains once the solder melts to mechanically keep the cap and substrate together. Hence, this seal may not be environmentally secure either.

Yet another similar cooling assembly is illustrated in the IBM Technical Disclosure Bulletin Vol. 27, No. 7A, December 1984 at page 3915. A suitable seal 18 is shown for securing the cap 14 to the substrate 12, although exactly what material is suitable is not there defined. Attached to the cap 14 is a fin assembly. This assembly would suffer the same problems outlined above with respect to the seal 18 unless the coefficient of expansion of cap and the substrate are substantially the same. In the case of ceramic structures, materials which have a similar coefficient of expansion typically are not good thermal conductors and hence do not make good heat sinks. This problem can be overcome somewhat by the design under discussion by bonding a fin assembly of a good thermally conductive material to the cap.

Another heat removal structure is illustrated in the IBM Technical Disclosure Bulletin Vol. 22, No. 6 November 1979 at pages 2294–2296. In this arrangement, a low temperature melting solder is used in the grap between a chip and a heat sink imbedded in a ceramic module cap. If the heat sink had a thermal coefficient of expansion which was quite different from that for ceramic as would be the case if the heat sink were made of aluminum or copper, it would be very difficult to maintain an environmentally secure seam between the heat sink and the ceramic cap.

It is, accordingly, the principal objective of the present invention to provide a thermally efficient heat sink which is environmentally secure.

It is a further objective of the invention to provide an environmentally secure and thermally efficient heat sink for a semiconductor module having a plurality of chip sites thereon.

It is still a further objective of the invention to provide an environmentally secure and thermally efficient heat sink for a semiconductor module with a plurality of chip sites thereon which is designed to minimally affect the circuit configuration on the module.

It is a further objective of the invention to provide an environmentally secure and thermally efficient heat sink for a semiconductor module with a plurality of chip sites wherein space is also made available for engineering change wiring on the surface of the module without interfering with the cooling provided by the heat sink.

BRIEF DESCRIPTION OF THE INVENTION

The environmentally secure heat sink of the present invention is designed to minimally impact the size of a module while providing the ability to efficiently cool the module and permit engineering change wiring to be added as well. This is accomplished with a two part heat sink assembly. The first part or frame member is made of a material of considerable strength with a coefficient of expansion substantially equal to that of the substrate and includes a perimeter rim which has a size and shape so as to contact a thin band like area around the perimeter of a module to be cooled thereby. The frame member is suitably metalized along its rim so as to adhere to the substrate with a solder bead or the like.

The frame member includes a plurality of fins disposed around the perimeter thereof. It also includes a support surface disposed inward of the fins around the perimeter. A high thermal conductivity insert member is disposed inward of the fins on the perimeter of the frame member and has a lower surface resting on the support surface of the frame member. The high thermal conductivity insert member is made of a material which is highly thermally conductive and may have a coefficient of expansion which is quite different from that of the frame member. The high thermal conductivity insert member is bonded to the frame member with an environmentally secure bond that can withstand the stresses of heat cycling which normally occurs in typical applications of the heat sink of the present invention.

Projecting downwardly from the lower surface of the high thermal conductivity insert member is a plurality of projections each having a lower face which is substantially the size and shape of a chip to be cooled. The lower face of these projections is disposed in use closely adjacent to a chip site on the substrate upper surface. A plurality of transverse grooves are formed between the projections. These grooves form paths through which engineering change wiring can be passed in a manner which does not interfere with the heat sink operation.

Projecting upwardly from the lower part of the high thermal conductivity insert member are a plurality of fins. The fins are arranged in a manner so that air can be directed toward the heat sink in a direction perpendicular to the substrate and good flow will occur between the fins. Alternatively, forced air may be directed at the assembly in a direction parallel to the lower surface of the high thermal conductivity insert member to achieve good cooling as well.

DESCRIPTION OF THE DRAWINGS

The foregoing and other objects, advantages and features of the present invention are described further below in connection with the drawings which form a part of the disclosure wherein.

DETAILED DESCRIPTION

Figure 1:
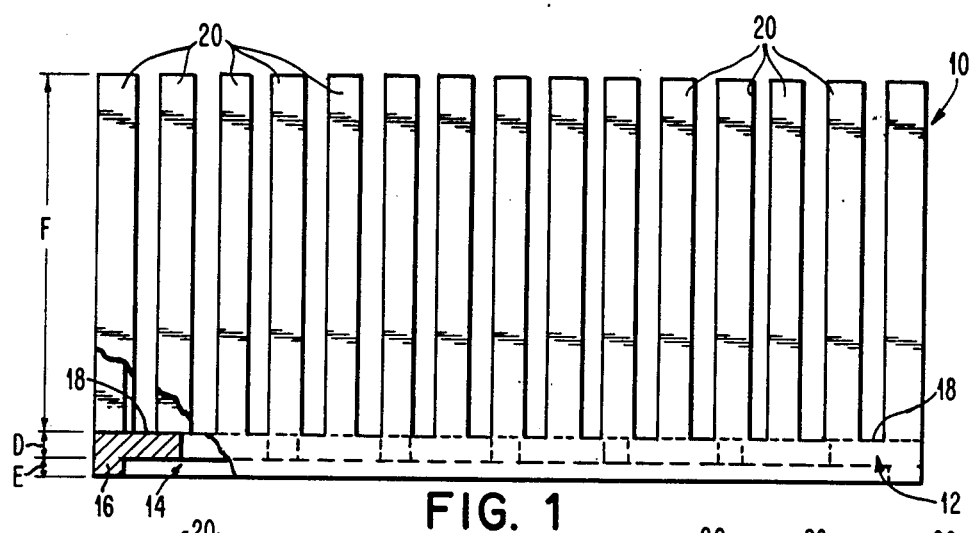
FIG. 1 is a side view of the frame member of the present invention.

Referring first to FIG. 1, a side elevational view of the heat sink frame member 10 is shown. The frame member 10 has a base portion 12, which, as illustrated in FIG. 1, lies in a horizontal plane and has a thickness as indicated by the double headed arrow D. Extending downwardly from the lower surface 14 of the base portion 12 is a rim 16 which is disposed around the perimeter of the lower surface 14. The rim 16 extends below the lower surface 14 by a distance indicated by the double headed arrow E. The rim 16 is disposed around the perimeter of frame member 10, the lower surface of which substantially forms a plane which, in use is bonded to the module to be cooled by the heat sink of the present invention.

Extending upwardly from the upper surface 18 of the base portion 12 is a plurality of protective heat radiating means 20. The heat radiating means 20 are disposed around the perimeter of the frame member 10 in a manner best illustrated in FIG. 2. Each such heat radiating means 20 extends above the upper surface 18 by a distance indicated by the double headed arrow F.

Figure 2:
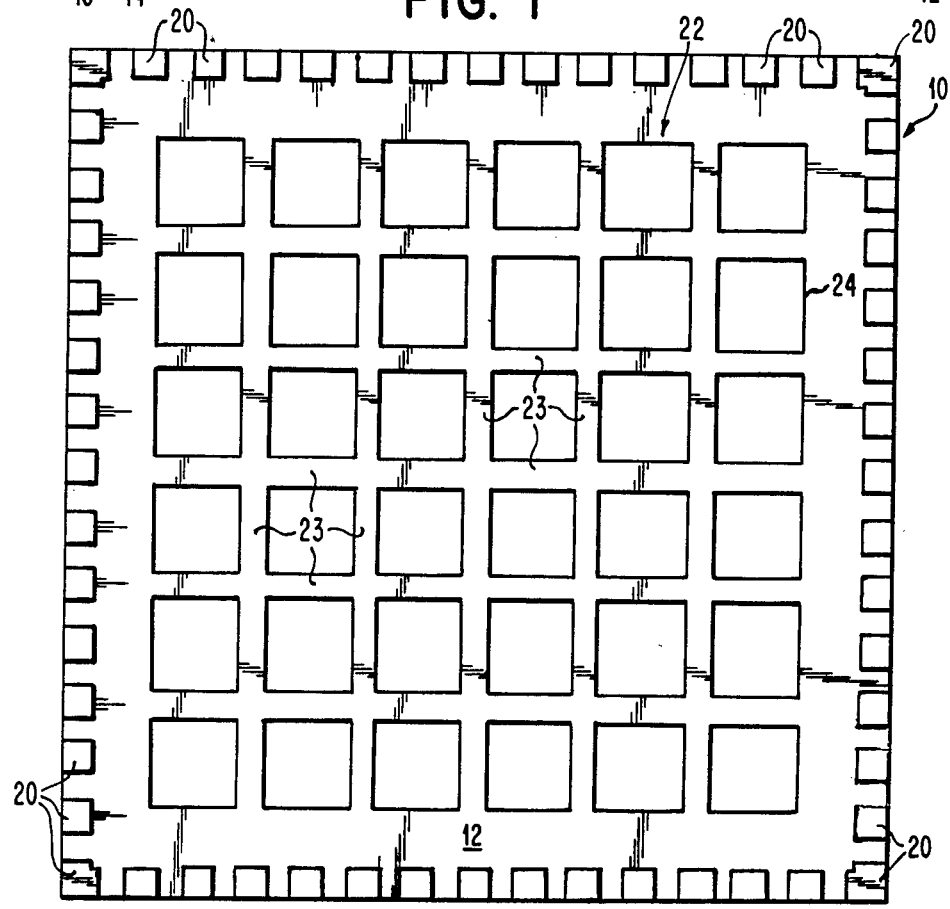
FIG. 2 is a view from below of the frame member.

In the preferred embodiment of the present invention the frame member 10 is made of a material known as "Kovar" alloyed metal which is manufactured by Carpenter Technology Corporation, Reading, Pennsylvania ("KOVAR" is a registered trademark of Carpenter Technology Corporation). This material principally comprises 29% by weight nickel, 17% by weight cobalt, and the remainder is iron. In the preferred embodiment, the dimensions of the frame member 10 as illustrated in FIG. 2 are approximately 2.5 inches on each side. The corner heat radiating means 20 each have substantially a square cross section with a notch cut out of one corner, the cross section lying in a plane parallel to the base portion 12. The cross section of the corner heat radiating means 20 is approximately 0.126 inches on each side. The remaining heat radiating means 20 disposed around the perimeter of the frame member 10 have a cross sectional area in the direction perpendicular of the sheet of FIG. 1 which is approximately 0.090 by 0.126 inches. In addition, the length of the double headed arrow D is approximately 0.075 inches, the length of the double headed arrow E is approximately 0.05 inches and the length of the double headed arrow F is approximately 1.075 inches. These dimensions are selected as being suitable for a cooling device to be used with a substrate which is substantially square in shape and having a length on each edge of approximately 2.5 inches. These dimensions, however, may be modified to suit other applications for the cooling device of the present invention and need not be exactly as defined above.

The material selected for the frame member 10 in the present invention is Kovar alloyed metal or the equivalent as already defined. This particular material has been selected because it has excellent strength characteristics and has a thermal coefficient of expansion which is substantially identical to the thermal coefficient of expansion of a ceramic module to which the frame member 10 is designed to be bonded by means of a solder connection between the metalized rim 16 and a metalized band on the upper surface of a substrate (not shown). The reason for selecting this material is that as the substrate expands and contracts due to thermal cycling in normal applications of the present invention, the frame member 10 and the substrate to which it is bonded will expand and contract at the same rate thereby assuring that the bond between the frame member and the substrate is not broken. Accordingly, the atmosphere disposed between the frame member 10 and the substrate will remain undistributed by such thermal cycling.

As viewed in FIG. 2, the central area of the frame member 10 indicated generally by the arrow 22, has 36 square openings, such as opening 24, passing therethrough. These openings 24 are delineated by the central grid members 23 and disposed at positions which correspond to being located directly above chip sites which are located on the substrate to be cooled by the device of the present invention. Alternatively, the openings 24 may be positioned at locations other than as shown in FIG. 2 and may take on different dimensions. However, these openings should be disposed directly above the corresponding chip sites of the substrate to be cooled. As a further alternative design, the area where the 36 openings of FIG. 2 are located could be entirely a single opening leaving no central grid members 23.

Figure 3:
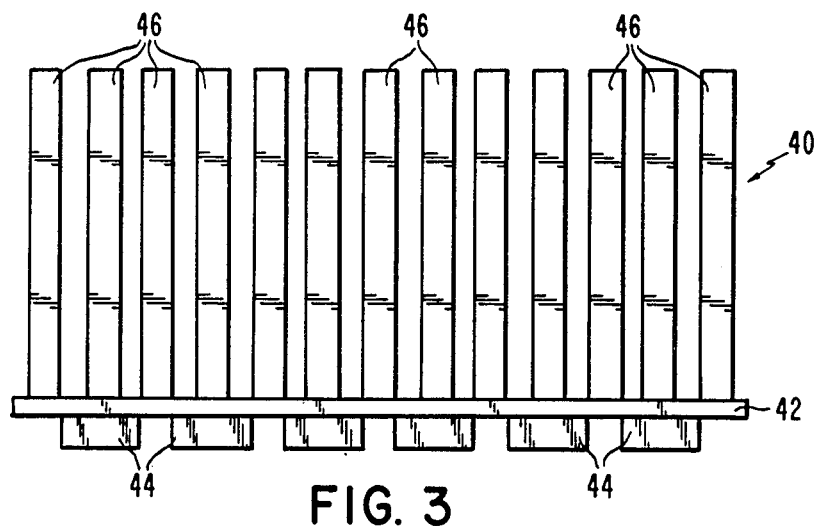
FIG. 3 is is a side view of the high thermal conductivity member of the present invention.
Figure 4:
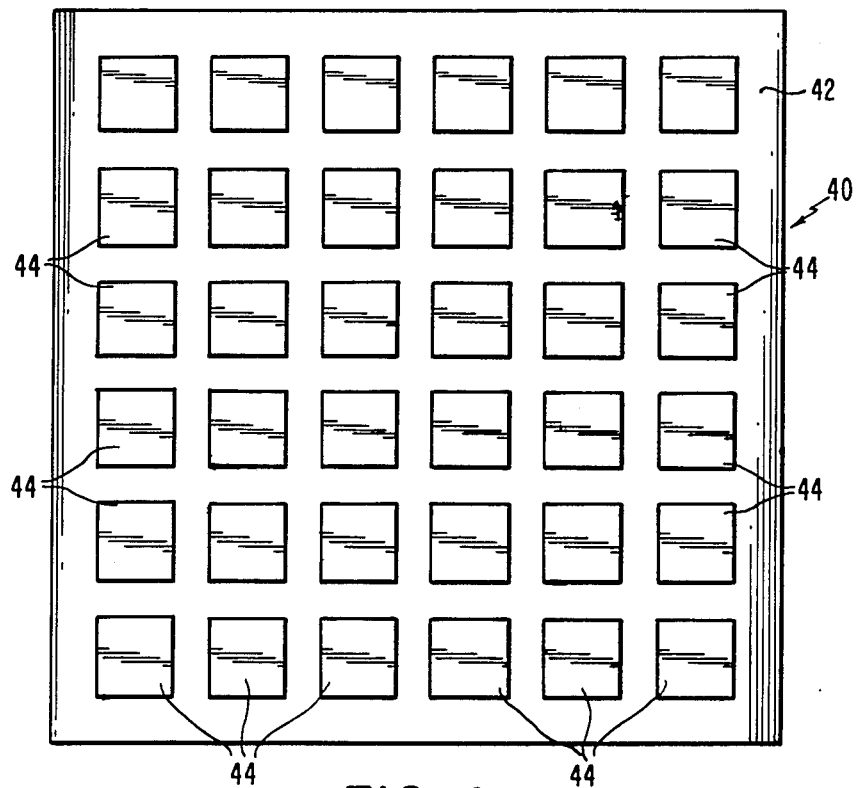
FIG. 4 is a view from below of the high thermal conductivity member.

Referring now to FIGS. 3 and 4, two different views are shown of the insert member, indicated generally as 40. The insert member comprises a metal insert which is shaped to fit within the frame member 10 of FIGS. 1 and 2 and is for providing a means with a high thermal conductivity for removing heat from each of the chips mounted on the module.

As viewed in FIG. 4, the insert member 40 has a square shaped base portion 42 whose outer dimensions are smaller than the dimension of the square shaped area disposed inward of the heat radiating means 20 of the frame member 10 as illustrated in FIGS. 1 and 2. Accordingly, the insert member 40 can be easily disposed inside the perimeter formed by the heat radiating means 20.

The insert member 40 has a plurality of projecting portions 44. Extending from the base portion 42 of the insert member 40 on the side opposite the side of the projecting portions 44 is a plurality of heat radiating means 46. The heat radiating means 46 are distributed substantially evenly over the upper surface of the base portion 42 as illustrated in Fig. 3 for the purpose of removing heat as evenly as possible from all the chips mounted on the module.

In the preferred embodiment of the present invention, the insert member 40 is made of a highly thermally conductive material such as aluminum, copper or the like and has a base portion 42 which is substantially 2.2 inches square and is 0.05 inches thick. Each of the projecting portions 44 project below the base portion 42 by a distance of about 0.1 inches. Each such projecting portion 44 has a dimension of about 0.24 inches square as illustrated in FIG. 4. The upwardly projecting heat radiating means as illustrated in FIG. 3 are each about 0.1 inches square and project above the base portion 42 approximately 0.95 inches. By reason of this dimensional relationship, there are 169 such heat radiating means 46 which project above the base portion 42 in the configuration illustrated in FIG. 3. It will be noted by those of skill in the art that the dimensions selected fro frame member 10 and the insert member 20 are selected so that the insert member 40 can be placed within the perimeter formed by the heat radiating means 20 of the frame member permitting the projecting portions 44 thereof to project through the base portion 12 of the frame member and extend below the lower surface 14 of the base portion 12. This configuration is illustrated, for example, in FIG. 6.

The insert member 40 is preferably made of a material having high thermal conductivity so as to conduct heat away from the chips of the module being cooled. Many suitable materials are available such as aluminum. Another suitable material is Zr-Cu 15000 which is comprised of about 99.8% Cu by weight, 0.15% Zr by weight and the remainder is impurities. This material has a thermal conductivity of about 880 Btu cm/ degree C. There are others which have higher thermal conductivity, however, this material is desirable as it has a coefficient of expansion which is closer to that of Kovar alloyed metal than other materials and hence is easier to assure an environmentally secure bond to the frame member 10 than other materials.

Figure 5:
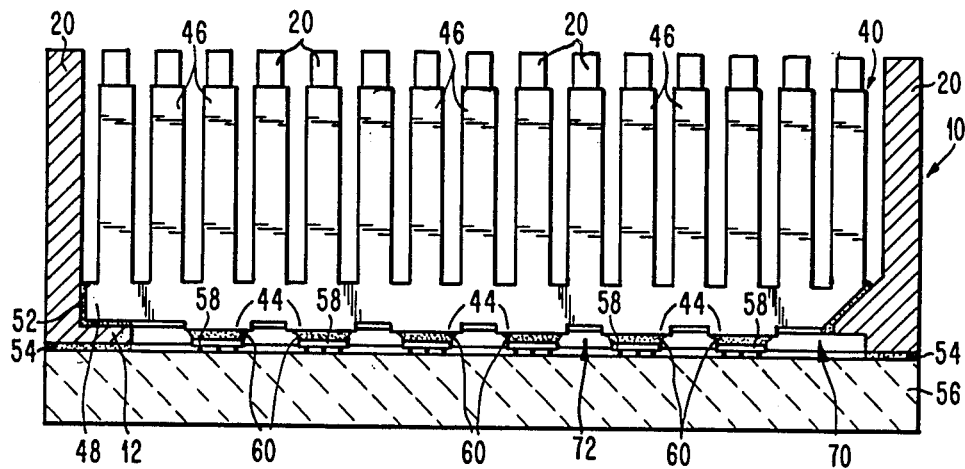
FIG. 5 illustrates in section an alternative frame member and an alternative high thermal conductivity member disposed adjacent to a module with chips mounted thereon.
Figure 6:
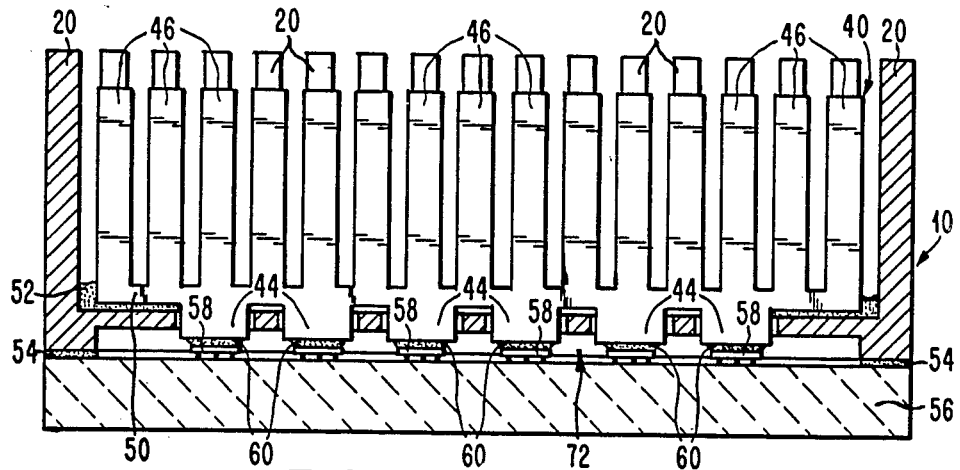
FIG. 6 illustrates in section the preferred embodiment for a frame member and high thermal conductivity member disposed adjacent to a module with chips mounter thereon.

As illustrated generally at 48 in FIG. 5 or generally at 50 in FIG. 6, part of the base portion 42 of the insert member 40 overlies part of the base portion 12 of the frame member 10. Disposed between the base portion 42 of the insert member 40 and the base portion 12 of the frame member is a frame to insert member bond 52 which bonds the insert member 40 to the base portion 12 and additionally provides an environmental seal between the insert member and the frame member. This bond 52 may be accomplished by welding, brazing, soldering or simple adhesive curing if limited permeation can be tolerated over the planned life of the product. In the preferred embodiment, the bond 52 is formed by a dual sealing with an outer adhesive band providing adhesion and an inner band of low temperature melting solder providing resistance to permeation. The solder preferably melts at or below the normal operating temperature of the module. The solder is contained in its proper location by suitable localized surface treatment of the insert member and the frame member in the vicinity of the solder band to promote wetting where the solder is desired. Suitable surface treatment may also be required adjacent the solder band location to prevent solder withdrawal. Such suitable surface treatment depends on the materials used to make the frame and insert members and are well known to those skilled in this art.

The outer adhesive band can be made of a polyimid or polyvinyl butyral. In the alternative, the adhesive can be an adhesive marketed under the trademark Sylgard 577 and manufactured by Dow Corning Corporation of Midland, Michigan ("SYLGARD" is a registered trademark of Dow Corning Corporation) or other adhesive which is not subject to out gassing of impurities. The exact bond selected for this application, however, must satisfy the desired level of environment security and must not be subject to breakage due to thermal cycling stresses over the planned life of the module. The sequence of bonding the frame to substrate and the insert to frame is established by the hierarchy of temperatures required during the bonding process.

As already has been noted, a solder seal is formed at 54 between the frame member 10 and the module substrate 56 thereby providing an environmental seal between the substrate and the frame. Accordingly, so long as the seals 52 and 54 remain substantially environmentally impervious, the atmosphere contained within the assembly disposed between the substrate 56, the frame member 10 and the insert member 40 will remain the same and, accordingly, performance of the module will not be adversely affected by changes in that environment and particularly, changes in the environment humidity.

Figure 7:
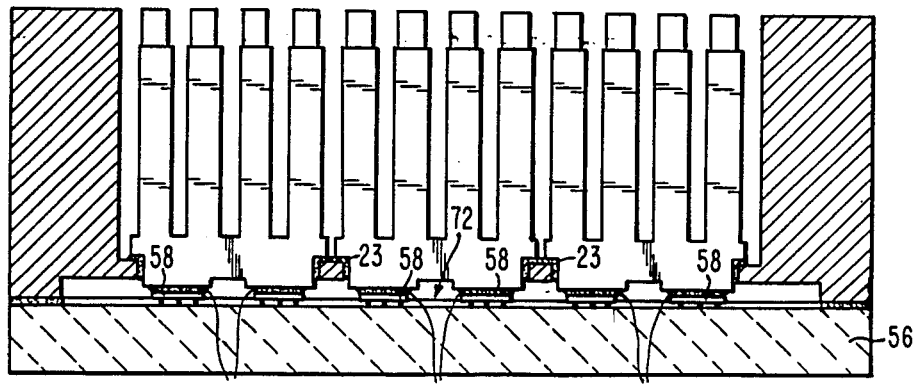
FIG. 7 illustrates in section another alternative design for the frame member and a plurality of high thermal conductivity members used therewith to cool the chips mounted on the module.

As has already been discussed, the apparatus according to the present invention is useful for cooling each of a plurality of chips mounted on a substrate made of ceramic or other suitable material. The location of these chips is illustrated in FIGS. 5, 6 and 7 as illustrated at 58. The projecting portion 44 of the insert member 40 as illustrated in these drawings and the lower surface thereof, is disposed slightly above each chip 58. The gap between the projecting portion 44 and the chip 58 disposed directly below the projecting portion 44 is filled by a heat transmitting grease as illustrated at 60 or other suitable material for transmitting heat from a chip to the insert member which serves as a heat sink for each of the chips. The heat sink of the present invention in most applications would have forced air passing between the heat radiating means 20 and 46 to increase the heat flow from the heat sink to ambient. Such forced air, by reason of the present heat sink design, can be in a direction which is either vertical to or parallel to the plane of the upper surface of the substrate 56.

It will be noted from the design of the elements, as illustrated in FIGS. 5, 6 and 7 that the shape of the frame member 10 and the insert member 40 can vary quite considerably while retaining the functionality which has heretofore been described. The most pertinent aspects of the design as illustrated in these figures, is that the frame member should have a base with a rim for contacting the surface of a module to be cooled. The frame member also has heat radiating means for removing heat therefrom. The frame member further is preferably made of a material having a thermal coefficient of expansion which is substantially identical to that of the substrate to which it will be bonded. In this manner, the frame can be bonded to the substrate and the bond between these two members will not be adversely affected by thermal cycling of the module with the frame member bonded thereto.

Each of the configurations illustrated in Figs. 5, 6 and 7 have an insert member made of a high thermal conductivity material such as aluminum or Zr-Cu and is designed with a flange for resting on a corresponding support surface of the base member, the insert member is bonded to the frame member by a weld, braze, solder or an adhesive. The bond is not permeable and is selected to withstand the effects of thermal cycling of the module.

Some of the pertinent design deviations illustrated in FIGS. 5, 6 and 7 include having a sloping flange and support surface as indicated generally at 70 in FIG. 5. It should also be noted that the design illustrated in FIG. 5 does not include any central grid members of the type already been illustrated at 23 in FIG. 2. Further alternative designs for the support surface and flange are illustrated in FIGS. 6 and 7.

Those of skill in the art will also recognize tht a reasonably sized open area is formed as illustrated generally at 72 in FIGS. 5, 6 and 7. This area 72 provides a space in each configuration in which engineering wiring changes for the module can be routed.

It will also be noted from the designs illustrated in FIGS. 5, 6 and 7 that the number of central grid members 23 can be varied from one configuration to another. In FIG. 5, for example, there are no central grid members illustrated while in FIG. 6, the number illustrated corresponds to the number shown in FIG. 2. In FIG. 7, however, the number of central grid members 23 has been substantially reduced from five in the embodiment illustrated in FIG. 6 to two. Accordingly, the number and configuration of the central grid members 23 is not critical to the invention.

It should also be noted that dimensions of the heat radiating means 20 extend above the top of the heat radiating means 46 when the insert member 40 is bonded to the frame member 10. This protects the insert member 40 from having its heat radiating means 46 damaged if the assembly were dropped. It also protects the chips on the substrate from receiving direct impact due to being dropped.

While the foregoing description of the present invention has been made with particular emphasis on the preferred embodiments illustrated in the drawings, it will be readily recognized by those of skill in the art that the various changes in the structural design illustrated above and other changes may be made to the structure of the heat sink according to the present invention without departing from the spirit and scope of that invention as defined by the following claims.

What is claimed is:

1. A thermally efficient and environmentally secure heat sink for cooling a semiconductor module comprising, in combination:
   a frame member having a base portion thereof, said base portion having a rim, formed around the perimeter of said base portion and extending from one side thereof, for contacting a surface of a module to be cooled thereby, said frame member having first heat radiating means for removing heat therefrom disposed around the perimeter of said base portion and disposed on the side opposite said rim and projecting in a direction opposite said rim, said frame member including a support surface disposed inward of said heat radiating means;
   a high thermal conductivity member including a base region with a flange which, in use, rests on said support surface, said base region having a plurality of projections each of which extends beyond said support surface toward the surface of the module to be cooled but does not extend beyond the plane in which said rim lies, said high thermal conductivity member including second means to radiate heat extending in a direction opposite said projections a distance, in use, which is less than the extent of projection of said first heat radiating means;
   said frame member being constructed of a material having a thermal coefficient of expansion substantially the same as the thermal coefficient of expansion of the module to which the heat sink is to be attached; and
   environmentally secure means to bond said high thermal conductivity member to said support surface of said frame member so that the bond therebetween is not permeable and remains not permeable after repeated thermal cycling of the heat sink.

2. The heat sink of claim 1 wherein said bonding means includes two different bonds, one said bond providing the strength to keep the members together despite extensive thermal cycling and the second bond means is operative to assure the bond is not permeable.

3. The heat sink of claim 1 wherein said first and second means to radiate heat includes a plurality of fins.

4. The heat sink of claim 3 wherein said fins are arranged so that air can be easily forced through said fins from a plurality of directions to thereby increase the heat transfer from the module to ambient.

5. The heat sink of claim 2 wherein said first bond comprises an adhesive bond.

6. The heat sink of claim 2 wherein said second bond comprises a low temperature melting solder which melts at a temperature below the normal operating temperature of the module.

7. The heat sink of claim 5 wherein said second bond comprises a low temperature melting solder which melts at a temperature below the normal operating temperature of the module.

8. The heat sink of claim 1 wherein said projections extend beyond said base portion of said frame a sufficient distance to create a clearance between said projections for engineering change wiring or positioning of other components.

9. The heat sink of claim 2 wherein said second bond comprises a solder which melts at a temperature above the normal operating temperature of the module but below the temperature at which damage to the assembly occurs due to thermal cycling.

10. The heat sink of claim 5 wherein said second bond comprises a solder which melts at a temperature above the normal operating temperature of the module but below the temperature at which damage to the assembly occurs due to thermal cycling.

11. The heat sink of claim 2 wherein said second bond comprises a low temperature melting solder which melts at a temperature below the normal operating temperature of the module which is below the temperature at which damage results due to thermal cycling.

12. The heat sink of claim 5 wherein said second bond comprises a low temperature melting solder which melts at a temperature below the normal operating temperature of the module which is below the temperature at which damage results due to thermal cycling.

13. An environmentally secure and thermally efficient heat sink assembly for cooling an integrated circuit module having a plurality of chip sites thereon comprising, in combination:

a frame member having a base portion and a rim extending therefrom a distance D where D is greater than the height of any chip above the surface of the module to be cooled, said frame member including a first plurality of fins extending from said base portion and disposed around the perimeter of said frame member, said frame member having a support surface disposed inward of said fins and said frame member is made of strong material having a thermal coefficient of expansion which is substantially the same as the thermal coefficient of expansion for the substrate of the module being cooled;

an insert member having a base portion with a surface for resting on said support surface, said insert member being made of a material having high thermal conductivity and having a plurality of projections from the base portion thereof, each projecting toward a chip site on a substrate to be cooled, each said projection extending from the base portion of said insert member a distance which in use is sufficient to almost contact a chip disposed adjacent thereto and with the aid of a thermal conducting paste permitting heat transfer from the chip to the base portion of said insert member, said base portion additionally including a second plurality of cooling fins projecting from said base portion a distance less than the extent of projection of said first plurality of fins; and bonding means to couple said insert member to said frame member so that the bond formed thereby is impervious to ambient atmosphere entering the area between the module to which said frame, in use, is bonded, said bonding means remaining impervious to ambient atmosphere despite thermal cycling which occurs in normal use of the assembly.

14. The heat sink assembly of claim 13 wherein said bonding means includes two different bonds, one said bond providing the strength to keep the members together despite extensive thermal cycling and the second bond means is operative to assure the bond is not permeable.

15. The heat sink of claim 13 wherein said bonding means includes a first bond which comprises an adhesive bond.

16. The heat sink of claim 15 wherein said bonding means includes a second bond which comprises a low temperature melting solder which melts at a temperature below the normal operating temperature of the module.

* * * * *